US006957898B2

(12) United States Patent
Yu

(10) Patent No.: US 6,957,898 B2
(45) Date of Patent: Oct. 25, 2005

(54) ADHESIVE TYPE LED LEAD FRAME

(76) Inventor: San-Hua Yu, 3F, No. 117, Yan-Shou Road, Tu Cheng, Taipei Hsien (TW)

( * ) Notice: Subject to any disclaimer, the term of this patent is extended or adjusted under 35 U.S.C. 154(b) by 167 days.

(21) Appl. No.: 10/425,953

(22) Filed: Apr. 30, 2003

(65) Prior Publication Data

US 2004/0160778 A1 Aug. 19, 2004

(30) Foreign Application Priority Data

Feb. 13, 2003 (TW) ............................. 92202338 U

(51) Int. Cl.[7] .......................................... F21V 21/00
(52) U.S. Cl. ...................................... 362/249; 362/800
(58) Field of Search ............................... 362/249, 226, 362/800; 313/511, 512

(56) References Cited

U.S. PATENT DOCUMENTS

| 6,297,598 | B1 * | 10/2001 | Wang et al. ............. 315/169.3 |
| 6,345,903 | B1 * | 2/2002 | Koike et al. ................ 362/249 |
| 6,582,100 | B1 * | 6/2003 | Hochstein et al. .......... 362/294 |
| 6,680,568 | B2 * | 1/2004 | Fujiwara et al. ............ 313/501 |
| 6,866,394 | B1 * | 3/2005 | Hutchins et al. ............ 362/192 |
| 6,874,910 | B2 * | 4/2005 | Sugimoto et al. .......... 362/294 |
| 2001/0024368 | A1 * | 9/2001 | Henrici et al. .............. 362/249 |

* cited by examiner

Primary Examiner—Y. My Quach-Lee
Assistant Examiner—Peggy A. Neils
(74) Attorney, Agent, or Firm—Troxell Law Office, PLLC

(57) ABSTRACT

An adhesive type LED lead frame includes a crystal base, a positive pole plate, a base joint and a flat joint. The crystal base is a conductive solid base and has a base part at the center thereof with a locating recess with a lower thin adhesive part at two opposite sides thereof respectively. The positive pole plate is disposed at a lateral side of the crystal base with a flat joining part parallel to the adhesive parts, having a connecting part with a sense of direction corresponding the base part. The base joint and the flat joint are disposed between the crystal base and the positive pole plate and provide a very thin thickness respectively. The base joint is removed before a solid crystal or a chip being placed in the base part and connecting wires thereof being packaged. Also, the flat joint is removed after the packaging job so as to constitute two poles adhered to a circuit board.

6 Claims, 5 Drawing Sheets

ADHESIVE TYPE LED LEAD FRAME

BACKGROUND OF THE INVENTION

1. Field of the Invention

The present invention relates to an adhesive type LED frame and particularly to a LED lead frame mounted to a circuit by means of adhesion.

2. Description of Related Art

The LED (Light Emitting Diode) has been used as a light emitting component for years and it is the reason why the LED is adopted in many light devices such as a car light, a traffic indicating baton and illumination device that the LED is small sized and less power consumption being needed. Hence, for the product deign, the LED plays an indispensable role. The principle for operating the LED is a solid crystal or chip A is passed through with positive and negative currents so as to emit light. Mostly, the arrangement for the LED is in that the solid crystal or chip A is located at a led frame, which can extend outward a contact pole, and is packaged to form a lead frame with the solid crystal or chip A. Then, the lead frame is mounted to a circuit board for connecting the circuit thereon to form a close circuit. Accordingly, the lead frame design is a subject of research and development pursued by manufactures and also a subject of improvement to be performed by the manufactures. Currently, the surface melting technology (SMT) is getting popular being adopted for joining electronic components and the conventional way of the LED lead frame being mounted to a circuit board with insertion is needed to improve substantially.

SUMMARY OF THE INVENTION

A primary object of the present invention is to provide an adhesive type LED lead frame, which includes a crystal base, a positive pole plate, a base joint and a flat joint. The crystal base is a conductive solid base and has a base part at the center thereof with a locating recess with a lower thin adhesive part at two opposite sides thereof respectively. The positive pole plate is disposed at a lateral side of the crystal base with a flat joining part parallel to the adhesive parts, having a connecting part with a sense of direction corresponding the base part. The base joint and the flat joint are disposed between the crystal base and the positive pole plate and provide a very thin thickness respectively. The base joint is removed before a solid crystal or a chip being placed in the base part and connecting wires thereof being packaged. Also, the flat joint is removed after the packaging job so as to constitute two poles adhered to a circuit board.

BRIEF DESCRIPTION OF THE DRAWINGS

The present invention can be more fully understood by reference to the following description and accompanying drawings, in which.

DETAILED DESCRIPTION OF THE PREFERRED EMBODIMENT

Figure 1:
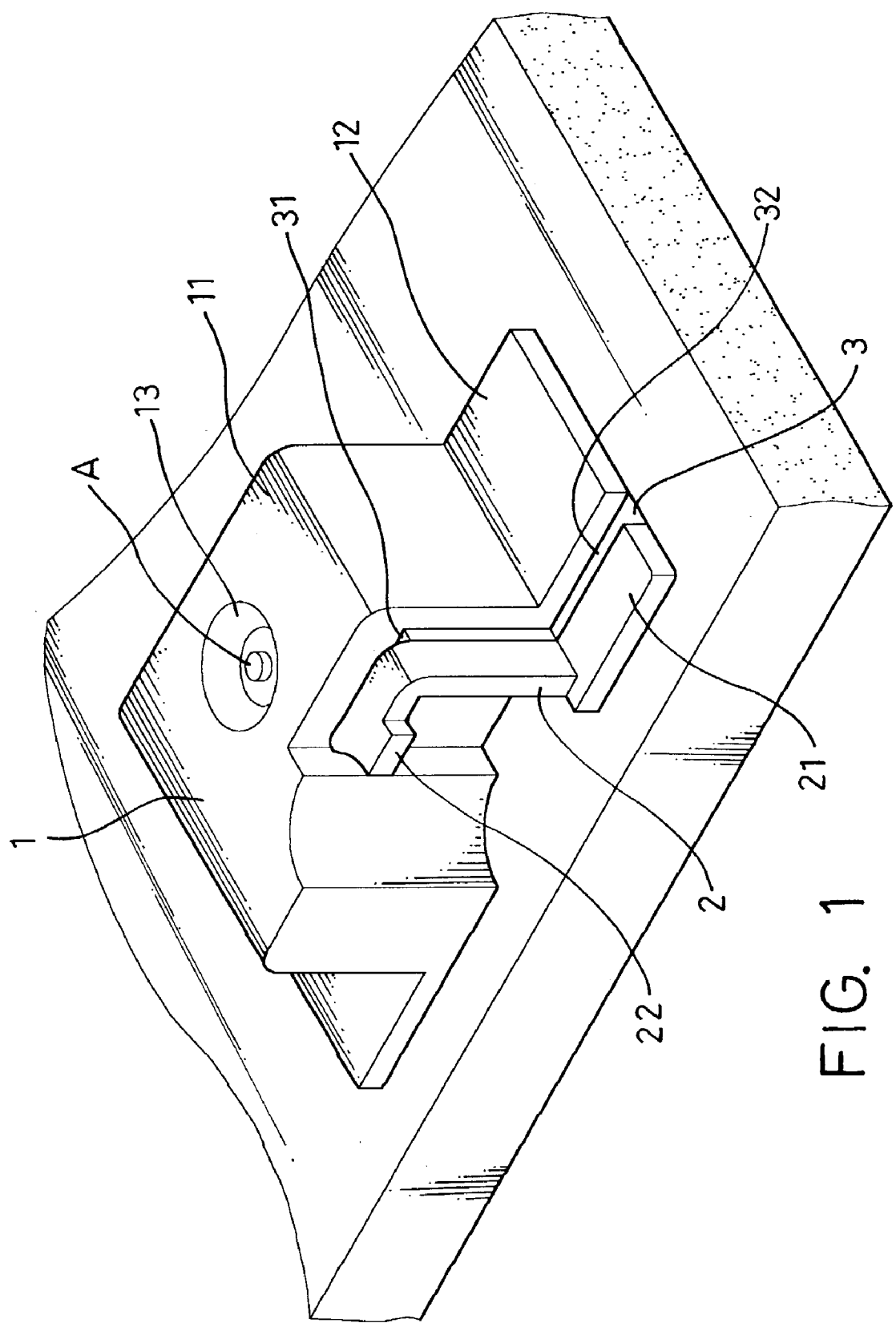
FIG. 1 is a perspective view of an adhesive type LED lead frame according to the present invention in a first embodiment thereof.

Referring to FIG. 1, basically, an adhesive type LED lead frame according to the present invention includes a crystal base 1, a positive pole plate 2 and a joint 3, which is between the crystal base 1 and the positive pole plate.

Wherein, the crystal base 1 is a solid base as a negative pole and it is made of conductive material. The crystal base 1 at the center thereof has a seat part 11 with an elevation higher than rest part thereof and at two opposite sides thereof has a low adhesive part 12 respectively with a flat bottom and an elevation lower than the seat part 11. The adhesive part 12 can be adhered to a printed circuit board during the crystal base 1 being attached to the circuit board. The base part 11 is thicker than the melt part 12 to facilitate heat dissipation and there is a locating recess 13 at the top of the base part 11 for receiving a solid crystal or a chip A.

The positive pole plate 2 is disposed at a lateral side of the crystal base 1 and also made of the same material as the crystal base 1. The positive pole 2 has a shape with a sense of direction corresponding to the crystal base 1 with a flat joining part 21 horizontally disposed for being adhered to the circuit board and a connecting part 22 extending upward and making a bend near the locating recess 13. The positive pole plate 2 is used as a positive pole while in use.

In fact, the crystal base 1 can be integrally formed with the positive pole plate 2 by way of pressing, wax free casting, etching, powder metallurgy, die casting, extrusion forming, forging, stamping and etc. Hence, in order to facilitate fabrication, the base joint 3 is formed with a thinner thickness between the crystal base 1 and the base part 11. That is, the base joint 31 is between the connecting part 22 and the base part 11 and a flat joint 32 is between the adhesive part 12 and the flat joining part 21 so that an integral piece can be constituted before being worked.

Figure 3:
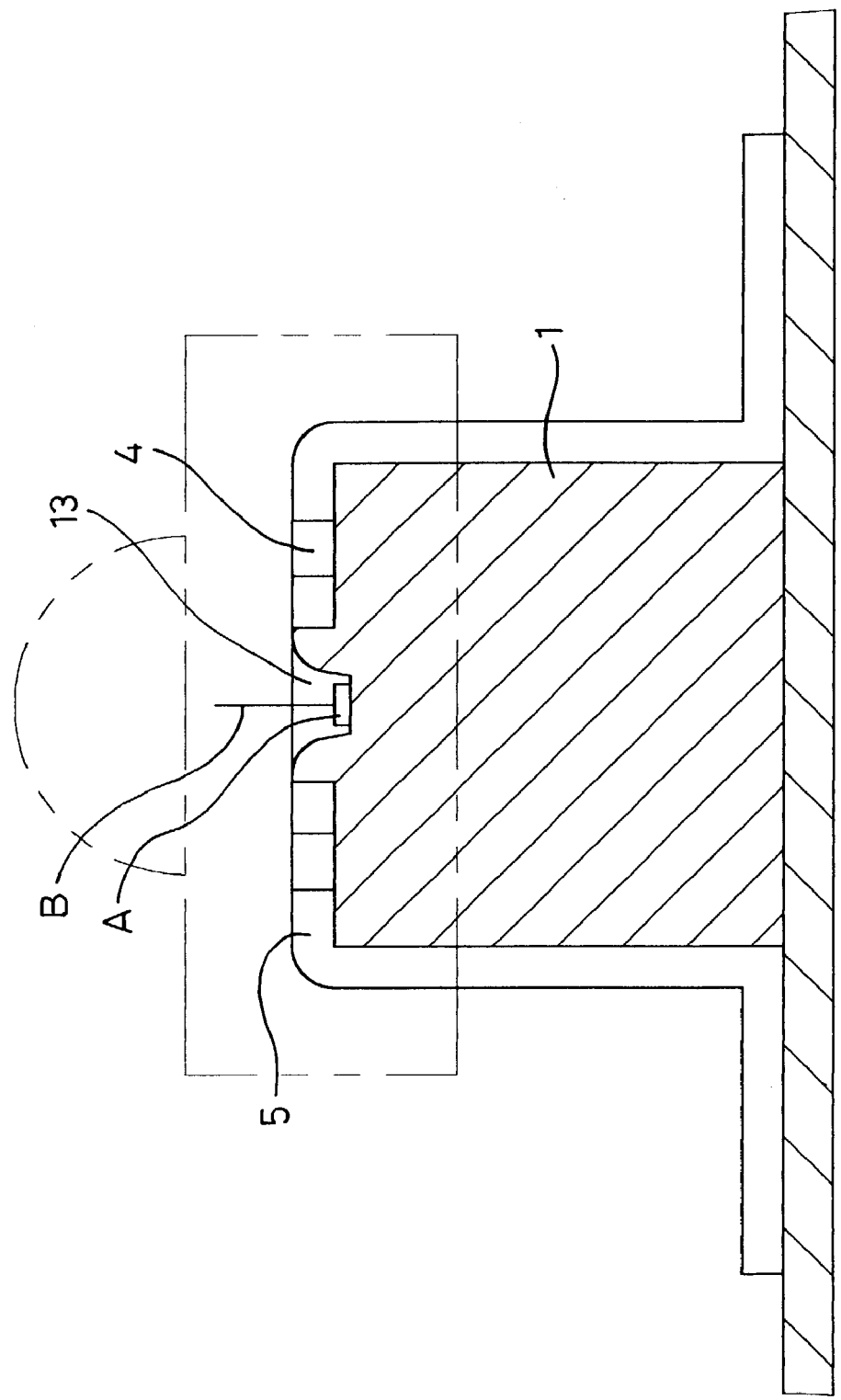
FIG. 3 is sectional view illustrating the adhesive type LED lead frame of the present invention being joined to a circuit after being packaged.
Figure 4:
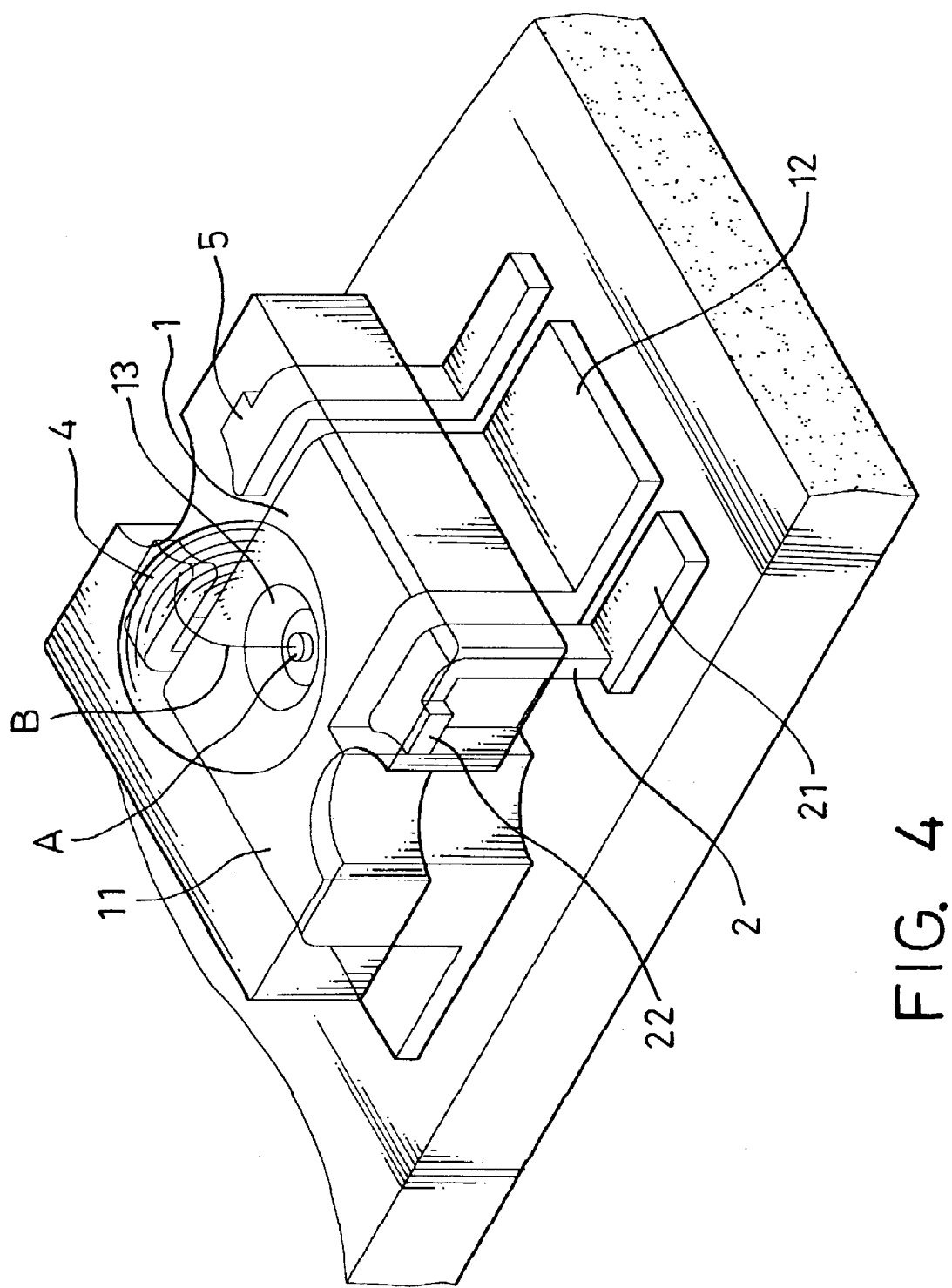
FIG. 4 is a perspective view illustrating the adhesive type LED lead frame of the present invention after being packaged.

While the preceding LED lead frame of the present invention is in use, the base joint 31 is removed by way of such as being cut off after the solid crystal or chip A being placed in the locating recess and connected to a wire B and then it is packaged such that the base part 11 at the top thereof is joined to the top of the connecting part 22 to form a state of firmness as shown in FIG. 3. Next, the flat joint 32 is removed to result in the positive plate 2 is separate from the crystal base 1 completely. In this way, it is not possible to occur the phenomenon of short circuit. FIG. 4 shows a perspective view after package.

As the foregoing, the lead frame of the present invention can be adhered to the circuit board to constitute a state of close circuit so that a trouble resulting from conventional pin insertion can be avoided.

Figure 2:
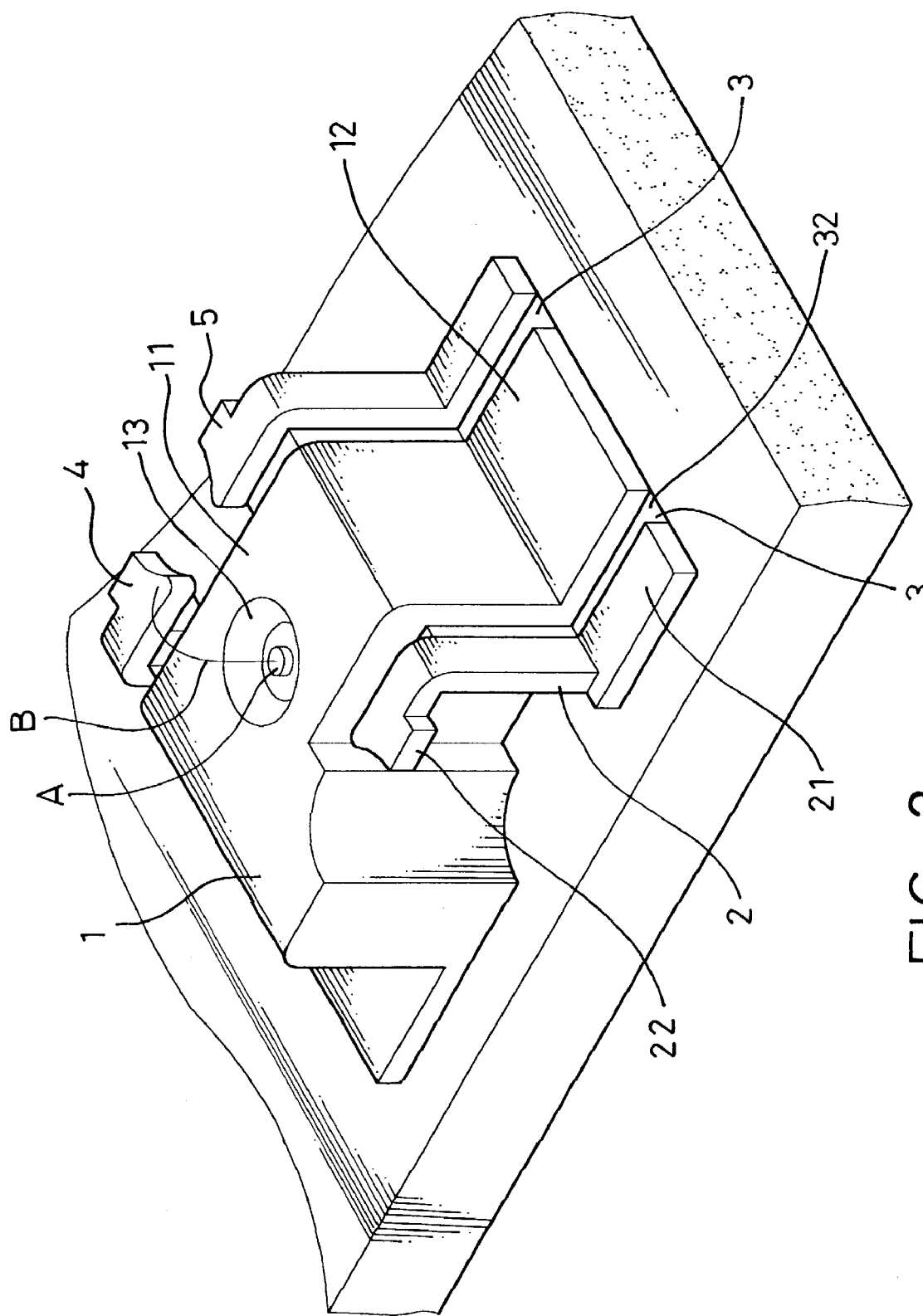
FIG. 2 is a perspective view of an adhesive type LED lead frame according to the present invention in a second embodiment thereof.

In case of two or more solid crystals or chips, with reference to FIG. 2, the crystal base 1 at another lateral sides provides a second positive pole plate 4 at a side and a third positive pole plate 5 at another side so as to be opposite to each other with the locating recess 13 as a center thereof. By the same token, the second and the third positive pole plates 4, 5 can be integrally formed with the crystal base 1 and have a thinner lower joint respectively. Then, the second and the third positive pole plates 4, 5 are removed sequentially before and after packaging. In this way, it is formed a configuration of three positive poles being disposed at both sides of the negative pole crystal base 1 so as to be used in case of two or more solid crystals or chips.

Figure 5:
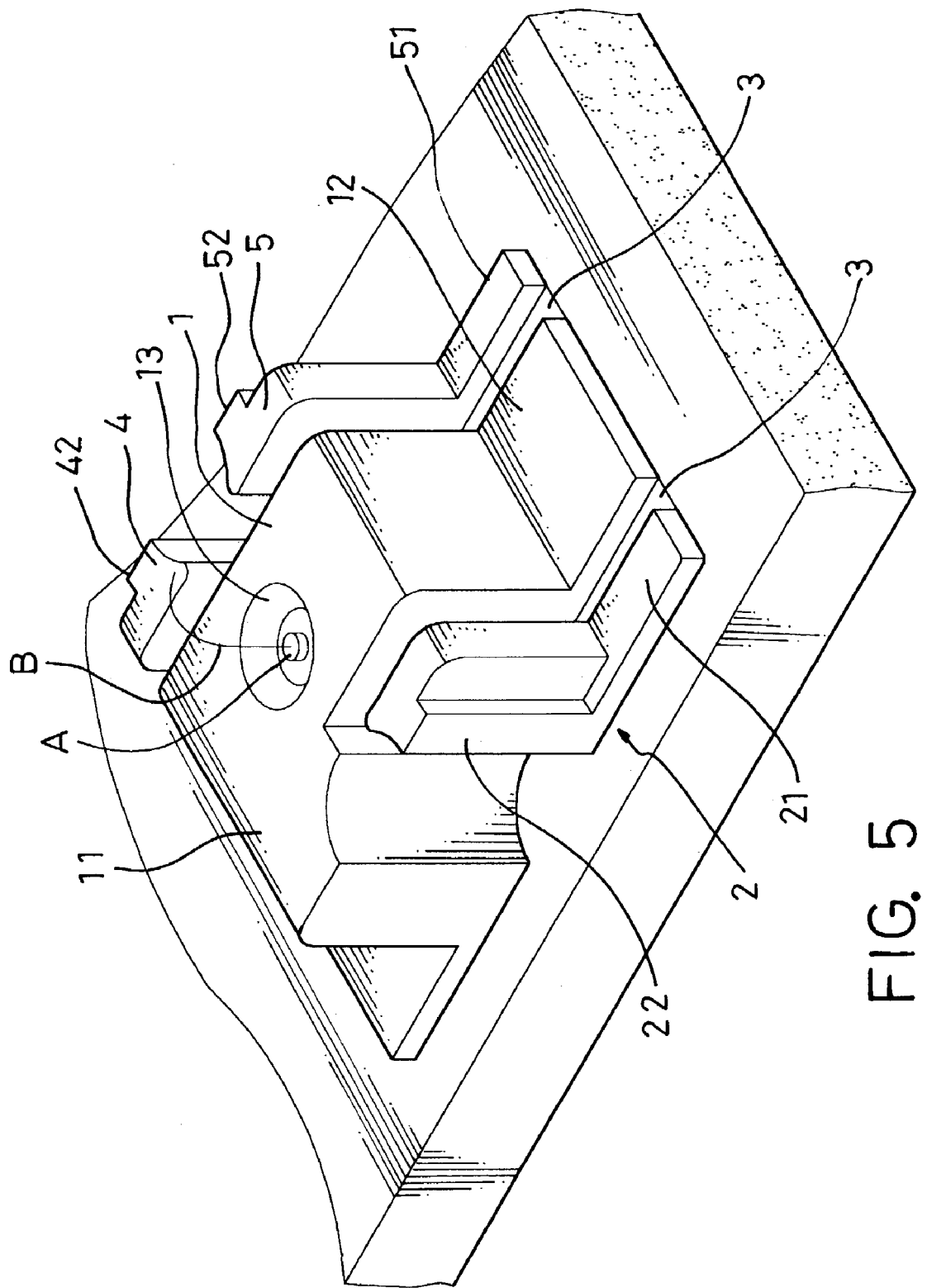
FIG. 5 is a perspective view of an adhesive type LED lead frame according the present invention in a third embodiment thereof.

With reference to FIG. 5, the third embodiment of the present invention is illustrated. The crystal base 1 at another lateral sides provides a second positive pole plate 4 at a side and a third positive pole plate 5 at another side so as to be opposite to each other with the locating recess 13 as a center thereof. By the same token, the second and the third positive pole plates 4, 5 can be integrally formed with the crystal base 1 and have a thinner lower joint respectively. Then, the second and the third positive pole plates 4, 5 are removed sequentially before and after packaging. In this way, it is formed a configuration of three positive poles being disposed at both sides of the negative pole crystal base 1 so as to be used in case of two or more solid crystals or chips. Wherein, the first positive pole plate 2 is disposed at a lateral side of the crystal base 1 with the same material as the crystal base 1 and has a shape with a sense of direction corresponding to the crystal base 1. Thus, the first positive pole plate 2 has a horizontal flat joining part 21 adhered to the circuit board and a connecting part 22 extending upward and near the locating recess 13. The second positive pole plate 4 and the third positive pole plate 5 are disposed at another lateral side of the crystal base 1 and is made with the same material as the crystal base 1 with the shape and the sense thereof corresponding to the crystal base 1 so that a flat joining part 41, 51 is provided (not shown) respectively for being adhered to the circuit board with a connecting part 42, 52 extending upward near the locating recess 13 respectively. Wherein, the first, second and third positive pole plates 2, 4, 5 have the same thickness as the crystal base 1 and are used as a positive pole respectively in practice.

In case of the preceding embodiment of the present invention is in use, the base joint 3 is removed by way of such as being cut off after the solid crystal or chip A being placed in the locating recess and connected to a wire B and then it is packaged such that the positive plate 2 is separate from the crystal base 1 completely. In this way, it is not possible to occur the phenomenon of short circuit. FIG. 5 shows a perspective view after package.

It is appreciated that the adhesive type LED lead frame according to the present invention can be made with performing to prevent inconvenience from stamping bends done with conventional art and avoid defective products so as to provide an advantage of consistent quality and dimensions. Furthermore, it can enhance effects of conductivity and heat dissipation due to the crystal base 1 being solid so as to increase the stability of light emitting device.

While the invention has been described with reference to a preferred embodiment thereof, it is to be understood that modifications or variations may be easily made without departing from the spirit of this invention, which is defined by the appended claims.

What is claimed is:

1. An adhesive type lead frame for a circuit board comprising:
    a) a crystal base having two adhesive parts and a seat part located between the two adhesive parts, the seat part having a locating recess located on a center of a top thereof, the crystal base being a conductive solid base and a negative pole, the seat part having a thickness greater than a thickness of the two adhesive parts;
    b) a first positive pole plate located along a first lateral side of and spaced apart from the crystal base and having a flat joining part and a connecting part, the flat joining part is positioned parallel with one of the two adhesive parts, the connecting part aligning with a top of the seat part, the first positive pole plate having a height equal to a height of the crystal base;
    c) a base joint removably located between the connecting part and the seat part; and
    d) a flat joint removably located between the selected seat part and the flat joining part,
wherein the base joint is removed before one of a solid crystal and a chip is installed in the locating recess and connected by a wire to the first positive pole plate, and the flat joint is removed after packaging producing the first positive pole plate and the negative pole adhered to the circuit board.

2. The adhesive type lead frame according to claim 1, wherein the crystal base is integrally formed with the first positive pole plate by a process selected from a group consisting of pressing, wax free casting, etching, powder metallurgy, die casting, extrusion forming, forging, stamping, and pre-casting.

3. The adhesive type lead frame according to claim 1, wherein the crystal base and the first positive pole plate are made of a material selected from a group consisting of copper, iron, and aluminum.

4. The adhesive type lead frame according to claim 1, wherein the base joint has a top surface located lower than top surfaces of the connecting part and the seat part, the flat joint has a top surface located lower than top surfaces of the selected seat part and the flat joining part.

5. The adhesive type lead frame according to claim 1, further comprising a second positive pole plate and a third positive pole plate located along a second lateral side of and spaced apart from the crystal base, the first lateral side and the second lateral side are on opposite sides of the crystal base.

6. The adhesive type lead frame according to claim 5, wherein the second positive pole plate and the third positive pole plate have a heights equal to the height of the crystal base.

* * * * *